(12) United States Patent
Hou et al.

(10) Patent No.: US 12,120,962 B2
(45) Date of Patent: Oct. 15, 2024

(54) METHOD FOR FABRICATING SEMICONDUCTOR DEVICE

(71) Applicant: UNITED MICROELECTRONICS CORP., Hsin-Chu (TW)

(72) Inventors: Tai-Cheng Hou, Tainan (TW); Fu-Yu Tsai, Tainan (TW); Bin-Siang Tsai, Changhua County (TW); Da-Jun Lin, Kaohsiung (TW); Chau-Chung Hou, Kaohsiung (TW); Wei-Xin Gao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/504,176

(22) Filed: Nov. 8, 2023

(65) Prior Publication Data
US 2024/0081154 A1 Mar. 7, 2024

Related U.S. Application Data

(63) Continuation of application No. 17/180,876, filed on Feb. 22, 2021, now Pat. No. 11,871,677.

(30) Foreign Application Priority Data
Jan. 25, 2021 (CN) .......................... 202110095432.5

(51) Int. Cl.
*H10N 50/01* (2023.01)
*H10B 61/00* (2023.01)
*H10N 50/80* (2023.01)

(52) U.S. Cl.
CPC ............. *H10N 50/01* (2023.02); *H10B 61/00* (2023.02); *H10N 50/80* (2023.02)

(58) Field of Classification Search
CPC ......... H10N 50/01; H10N 50/80; H10B 61/00
See application file for complete search history.

(56) References Cited

U.S. PATENT DOCUMENTS

| | | | |
|---|---|---|---|
| 2015/0140819 A1 | 5/2015 | Huang et al. | |
| 2018/0286694 A1 | 10/2018 | Wang | |
| 2019/0103307 A1* | 4/2019 | Huang | ................... H10N 50/01 |
| 2019/0326509 A1 | 10/2019 | Yi | |
| 2020/0098976 A1 | 3/2020 | Jacob | |
| 2021/0083178 A1* | 3/2021 | Hsu | ....................... H10N 50/01 |
| 2021/0272896 A1 | 9/2021 | Lin | |
| 2022/0165940 A1 | 5/2022 | Shen | |

OTHER PUBLICATIONS

Yan et al., Flowable CVD Process Application for Gap Fill at Advanced Technology, ECS Transactions, 60 (1), 2014, pp. 503~506.

* cited by examiner

*Primary Examiner* — Shih Tsun A Chou
(74) *Attorney, Agent, or Firm* — Winston Hsu

(57) ABSTRACT

A method for fabricating a semiconductor device includes the steps of: providing a substrate, wherein the substrate comprises a MRAM region and a logic region; forming a magnetic tunneling junction (MTJ) on the MRAM region; forming a top electrode on the MTJ; and then performing a flowable chemical vapor deposition (FCVD) process to form a first inter-metal dielectric (IMD) layer around the top electrode and the MTJ.

5 Claims, 3 Drawing Sheets

METHOD FOR FABRICATING SEMICONDUCTOR DEVICE

CROSS REFERENCE TO RELATED APPLICATIONS

This application is a continuation application of U.S. application Ser. No. 17/180,876, filed on Feb. 22, 2021. The content of the application is incorporated herein by reference.

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of: providing a substrate, wherein the substrate comprises a MRAM region and a logic region; forming a magnetic tunneling junction (MTJ) on the MRAM region; forming a top electrode on the MTJ; and then performing a flowable chemical vapor deposition (FCVD) process to form a first inter-metal dielectric (IMD) layer around the top electrode and the MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
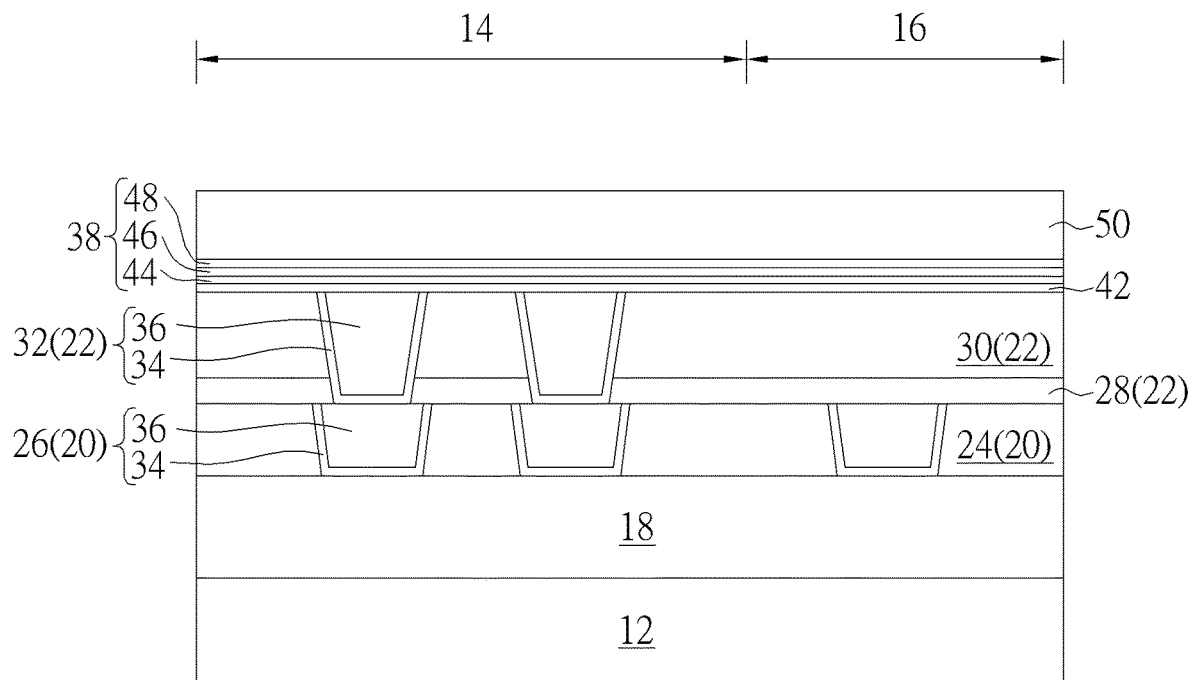
FIGS. 1-6 illustrate a method for fabricating a MRAM device according to an embodiment of the present invention.

Referring to FIGS. 1-6, FIGS. 1-6 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide (AlOx) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
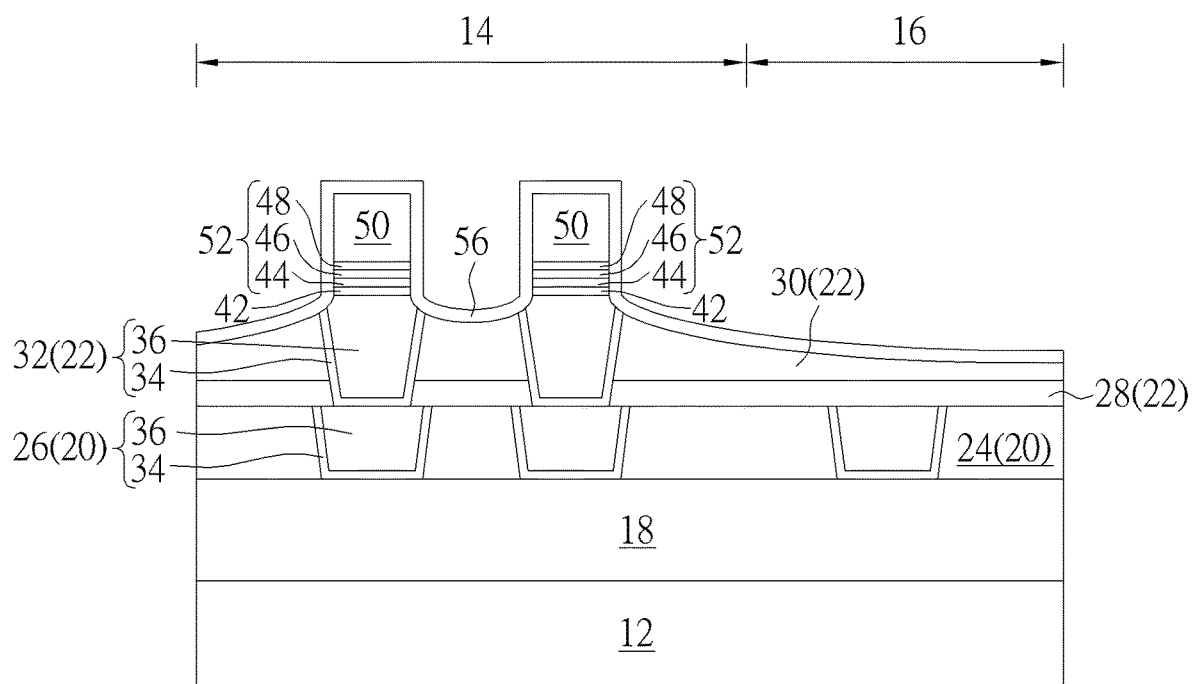

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52. Next, a cap layer 56 is formed on the MTJs 52 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
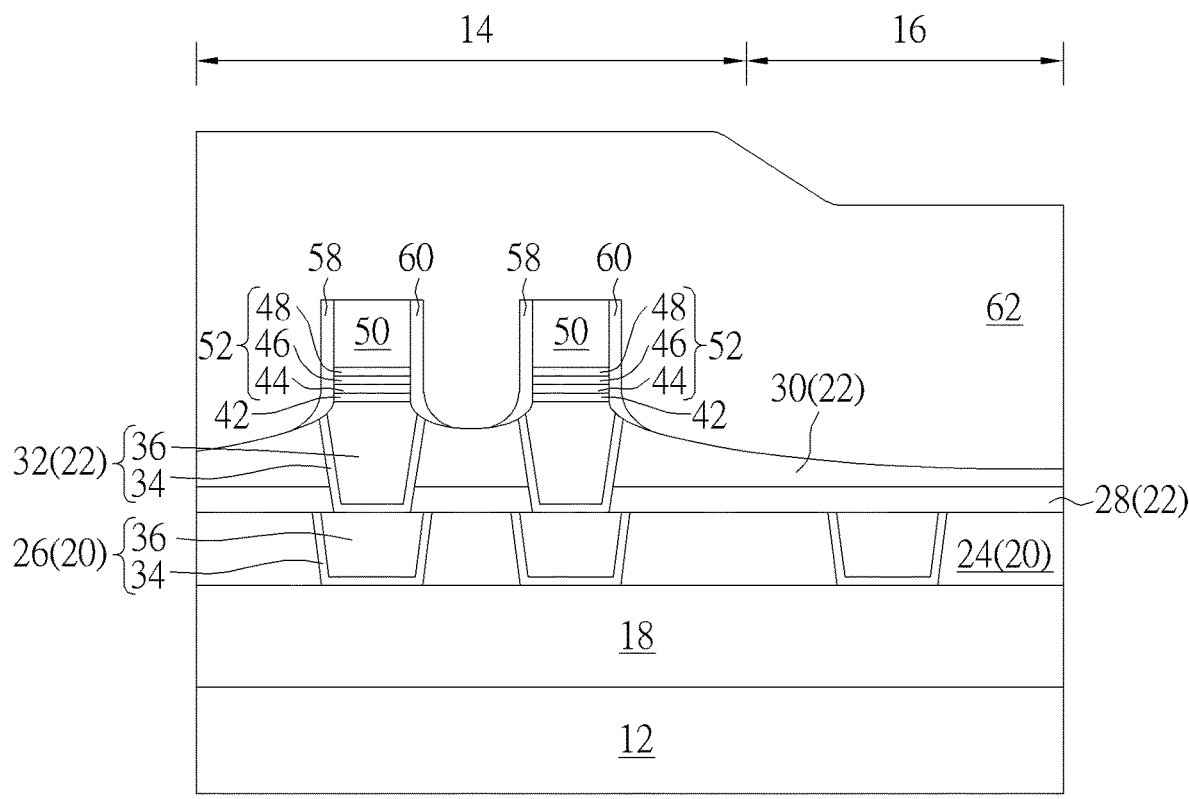

Next, as shown in FIG. 3, an etching back process is conducted to remove part of the cap layer 56 for forming spacers 58, 60 on sidewalls of each of the MTJs 52, and a flowable chemical vapor deposition (FCVD) process is conducted by using a temperature lower than 100° C. to form an inter-metal dielectric (IMD) layer 62 on the MTJs 52 and the IMD layer 30 on the logic region 16. In this embodiment, the IMD layer 62 preferably include an ultra low-k (ULK) dielectric layer including but not limited to for example porous material or silicon oxycarbide (SiOC) or carbon doped silicon oxide (SiOCH). It should be noted by using the FCVD process to form the IMD layer 62, the top surface of the IMD layer 62 on the logic region 16 would be slightly lower than the top surface of the IMD layer 62 on the MRAM region 14. Specifically, the height difference between the IMD layer 62 on the MRAM region 14 and the IMD layer 62 on the logic region 16 is less than 400 Angstroms.

Figure 4:
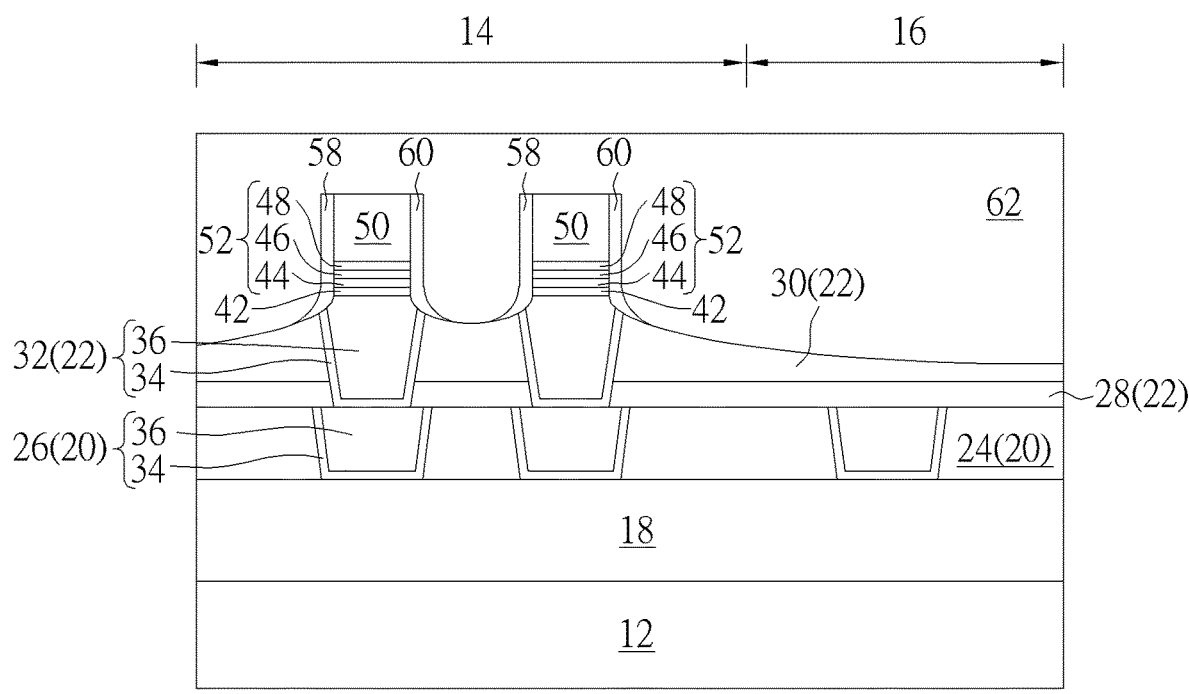

Next, as shown in FIG. 4, a planarizing process such as chemical mechanical polishing (CMP) is conducted to remove part of the IMD layer 62 on the MRAM region 14 and logic region 16 without exposing the top surfaces of the top electrodes 50 so that the top surface of the IMD layer 62 on the MRAM region 14 is even with the top surface of the IMD layer 62 on the logic region 16.

Figure 5:
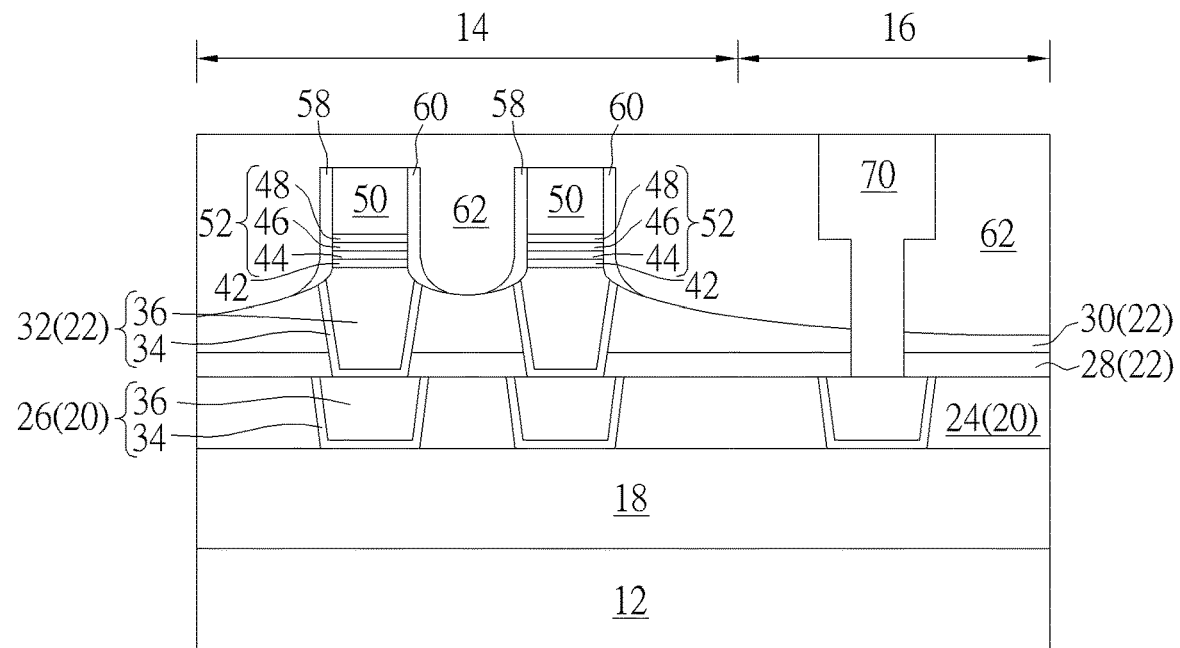

Next, as shown in FIG. 5, a pattern transfer process is conducted by using a patterned mask (not shown) to remove part of the IMD layer 62, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 70 in the contact hole electrically connecting the metal interconnection 26.

Figure 6:
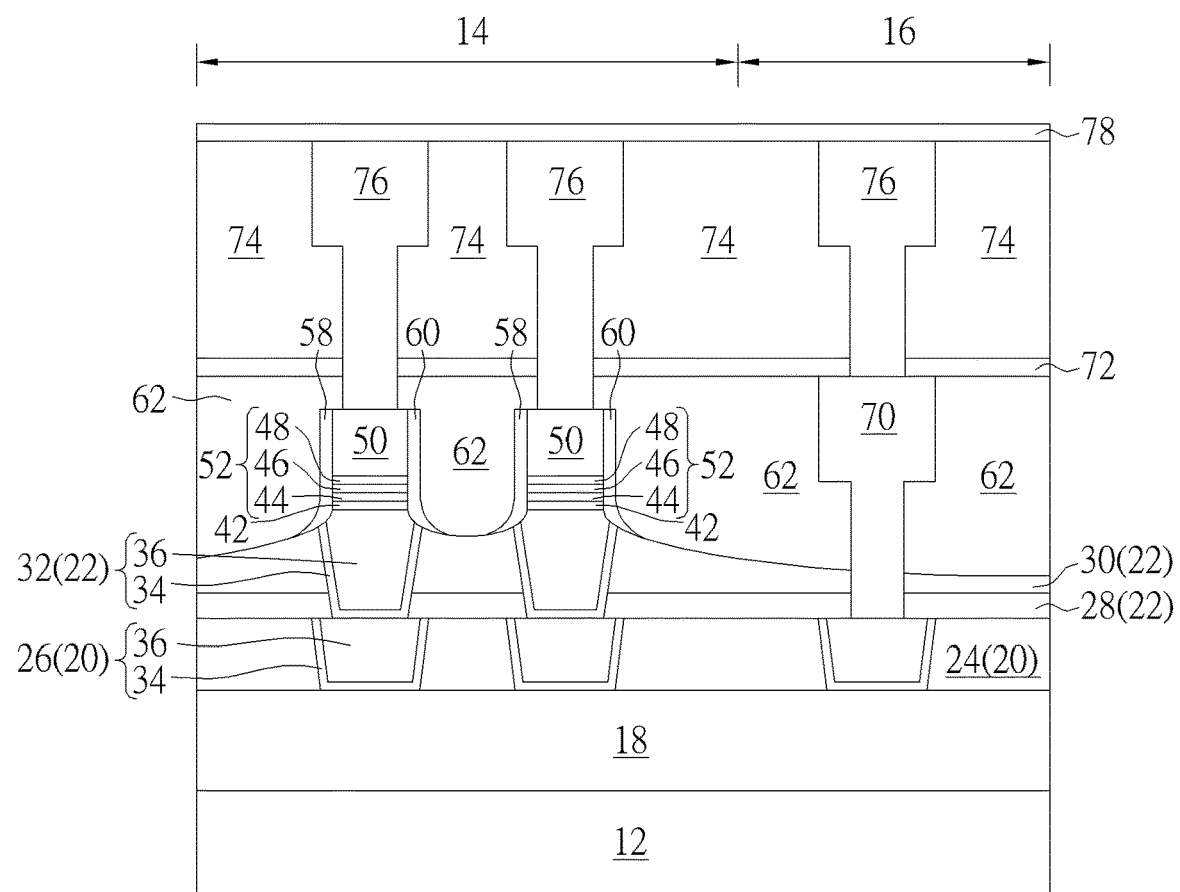

Next, as shown in FIG. 6, a stop layer 72 is formed on the MRAM region 14 and logic region 16 to cover the IMD layer 62 and metal interconnection 70, an IMD layer 74 is formed on the stop layer 72, and one or more photo-etching process is conducted to remove part of the IMD layer 74, part of the stop layer 72, and part of the IMD layer 62 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the MRAM region 14 directly contacts the top electrodes 50 underneath while the metal interconnection 76 on the logic region 16 directly contacts the metal interconnection 70 on the lower level. Next, another stop layer 78 is formed on the IMD layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Overall, in contrast to the conventional approach of first forming MTJs and then conducting an atomic layer deposition (ALD) process or plasma-enhanced chemical vapor deposition (PECVD) process to form an IMD layer covering the MTJs and the IMD layer on the logic region, the present invention preferably conducts a FCVD process to form the aforementioned IMD layer 62 for covering the MTJs 52 and the IMD layer 30 on the logic region 16 so that the height difference between the IMD layer 62 on the MRAM region 14 and the IMD layer 62 on the logic region 16 during the initial deposition stage could be minimized. By following this approach, it would be much easier and less burden for the CMP process to remove the IMD layer 62 on the two regions 14, 16 during the planarizing process and uniformity on both MRAM region 14 and logic region 16 could also be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate, wherein the substrate comprises a magnetoresistive random access memory (MRAM) region and a logic region;
   forming a magnetic tunneling junction (MTJ) on the MRAM region;
   forming a top electrode on the MTJ;
   performing a flowable chemical vapor deposition (FCVD) process to form a first inter-metal dielectric (IMD) layer around the top electrode and the MTJ, wherein a top surface of the first IMD layer on the logic region is lower than a top surface of the first IMD layer on the MRAM region and higher than a top surface of the top electrode, and the top surface of the first IMD layer directly on top of the MTJ and the top surface of the first IMD layer adjacent to the MTJ on the MRAM region comprise a completely planar surface;
   performing a planarizing process to planarizing the first IMD layer after performing the FCVD process, wherein a height difference between the first IMD layer on the logic region and the first IMD layer on the MRAM region before the planarizing process is less than 400 Angstroms; and
   forming a second metal interconnection on the logic region after planarizing the first IMD layer.

2. The method of claim 1, further comprising:
   forming a second IMD layer on the MRAM region and the logic region;
   forming a first metal interconnection in the second IMD layer on the MRAM region;
   forming the MTJ on the first metal interconnection;
   forming the first IMD layer on the MRAM region and the logic region;
   removing the first IMD layer on the logic region; and
   forming the second metal interconnection on the logic region.

3. The method of claim 2, wherein a top surface of the top electrode is lower than a top surface of the second metal interconnection.

4. The method of claim 2, further comprising:
   forming a stop layer on the first IMD layer;
   forming a third IMD layer on the stop layer; and
   forming a third metal interconnection on the MRAM region to connect to the top electrode and a fourth metal interconnection on the logic region to connect to the second metal interconnection.

5. The method of claim 1, further comprising performing a chemical mechanical polishing (CMP) process for planarizing the first IMD layer.

* * * * *